United States Patent
Jafri et al.

[11] Patent Number: 6,019,841
[45] Date of Patent: Feb. 1, 2000

[54] METHOD AND APPARATUS FOR SYNTHESIS AND GROWTH OF SEMICONDUCTOR CRYSTALS

[75] Inventors: Ijaz H. Jafri, Nashua; Mohan Chandra, Merrimack; Rick C. White, Nashua; Kedar P. Gupta, Merrimack, all of N.H.; Robert B. Farmer, Billerica, Mass.; Bernard D. Jones, Amherst, N.H.; David F. Bliss, Arlington, Mass.

[73] Assignee: G.T. Equuipment Technologies Inc.

[21] Appl. No.: 09/046,917

[22] Filed: Mar. 24, 1998

Related U.S. Application Data

[60] Provisional application No. 60/041,544, Mar. 24, 1997, and provisional application No. 60/076,027, Feb. 26, 1998.

[51] Int. Cl.[7] .................................................. C30B 15/02
[52] U.S. Cl. ............................ 117/201; 117/208; 117/14; 117/15; 117/17; 117/18
[58] Field of Search ..................................... 117/201, 208, 117/17, 18, 14, 15

[56] References Cited

U.S. PATENT DOCUMENTS

| | | |
|---|---|---|
| Re. 34,375 | 9/1993 | Mackintosh . |
| 4,185,081 | 1/1980 | Fauth et al. . |
| 4,345,467 | 8/1982 | Carlson . |
| 4,478,675 | 10/1984 | Akai . |
| 4,704,257 | 11/1987 | Tomizawa et al. . |
| 4,750,969 | 6/1988 | Sassa et al. . |
| 4,764,350 | 8/1988 | Adamski . |
| 4,783,320 | 11/1988 | Adamski et al. . |
| 4,816,240 | 3/1989 | Terashima et al. . |
| 5,030,315 | 7/1991 | Washizuka et al. ............ 117/18 |
| 5,074,953 | 12/1991 | Shirata et al. . |
| 5,091,043 | 2/1992 | Shirata et al. . |
| 5,240,685 | 8/1993 | Nishizawa . |
| 5,290,395 | 3/1994 | Matsumoto et al. ............ 117/18 |
| 5,385,862 | 1/1995 | Moustakas ...................... 117/108 |
| 5,462,011 | 10/1995 | Tomzig et al. ..................... 117/18 |
| 5,493,985 | 2/1996 | Bliss et al. . |
| 5,524,571 | 6/1996 | Kawasaki . |
| 5,681,758 | 10/1997 | Shiraishi . |

FOREIGN PATENT DOCUMENTS

| | | |
|---|---|---|
| 0 303 977 | 8/1988 | European Pat. Off. . |
| 0 355 746 | 8/1989 | European Pat. Off. . |
| 0 355 747 | 8/1989 | European Pat. Off. . |
| 0 476 389 A2 | 8/1991 | European Pat. Off. . |
| 0 803 593 A1 | 4/1997 | European Pat. Off. . |

OTHER PUBLICATIONS

Farges, A Method for the "In–Situ" Synthesis and Growth of Indium Phosphide in a Czochralski Puller, Journal of Crystal Growth 59, 1982, pp. 665–668, (Best Copy Available).
E. Tomzig/Wacker, Crystal Puller for INP, Chemitronic, 1986, 7pgs.
JP Farges/AM Roussel, Growth of INP from "In Situ", Lab. d'Electronique, 1983, 3pgs.
George A. Antypas, Syn. of Cruci. Shaped Polycrys., CrystaComm Inc., 1983, 5pgs.
Jean–Pierre Farges, Method for the "In–Situ" Syn., Lab. d'Electronique, 1982, 2pgs.

*Primary Examiner*—Robert Kunemund
*Attorney, Agent, or Firm*—Vernon C. Maine; Scott J. Asmus

[57] ABSTRACT

The invention is an improved method and apparatus for growing crystals that incorporates an isolation valve between the growth and injection chambers to allow the growth chamber to be maintained at operating temperature and pressure while decoupling the injector chamber in order to make changes necessary to restart or advance the process. Separate heating elements in the injector assembly or chamber provide related heating control. Upper and lower load cells and programmable signal amplifiers are configured to weigh and output the dynamic weight range of the loss or gain of process materials of the growth chamber crucible and the injector assembly, and are connected by electrical slip rings or wireless means to a computer control system.

20 Claims, 15 Drawing Sheets

METHOD AND APPARATUS FOR SYNTHESIS AND GROWTH OF SEMICONDUCTOR CRYSTALS

This application relates to pending U.S. application Ser. Nos. 60/041,544 filed Mar. 24, 1997 and 60/076,027 filed Feb. 26, 1998.

BACKGROUND OF THE INVENTION

This invention relates to methods and devices for synthesizing and growing compound single crystals; and more particularly to improvements thereof relating to segregated pressure chambers and monitoring of dynamic weight changes during the process.

BACKGROUND ART

Traditionally the synthesis of InP as well as GaAs has been done in two steps, resulting in a tremendous amount of wasted time, cost and energy. The access to the hot zone of a crystal growth furnace is difficult because of deep well configurations. Hence maintenance and cleaning of the system due to high phosphorus deposition results in a lot of wasted time. Due to radiation heating during injection, the synthesis process has inadequate control resulting in non-stoichiometric and unwanted InP composition. Although some progress has been achieved towards one-step in-situ synthesis and growth, deficiencies in process monitoring and control in synthesis and crystal growth have been major drawbacks in this kind of bulk crystal growth for compound crystals.

There are many examples in the prior art that provide useful context for the following explanation of this invention. Among them are the following: Bliss et al's U.S. Pat. No. 5,493,985 issued Feb. 27, 1996, Shirata et al's U.S. Pat. No. 5,074,953 issued Dec. 24, 1991, Shirata et al's U.S. Pat. No. 5,091,043 issued Feb. 25, 1992, Shirata's EPO Publication no. 0 355 746 A2 published Feb. 28, 1990, Shirata's EPO Publication no. 0 355 747 A2 published Feb. 28, 1990, Shiraishi's U.S. Pat. No. 5,681,758 issued Oct. 28, 1997, Mackintosh's U.S. Pat. No. Re. 34,375 (ref. 4,936,947) issued Sep. 14, 1993, Yoshida's EPO Publication no. 0 476 389 A2 published Mar. 25, 1992, Tomzig's *Crystal Puller for InP of High Quality and Large Dimensions* Wacker Chemitronic, III-V-Dep. Burghausen, FRG (1986), and Katsuoka's EPO Pub. no. 0 303 977 B1 published Feb. 28, 1889.

SUMMARY OF THE INVENTION

It is an object of the invention to provide an improved method and apparatus for the production of high purity compound single crystals of Indium Phosphide, Gallium Arsenide and other compound crystals.

It is a further object of the invention to provide a method and apparatus that provides the ability to maintain the growth chamber at operating temperature and pressure while decoupling the injector section in order to make changes necessary to restart or advance the process. To this end, an isolation valve is introduced into the system.

It is a further object to provide a method and apparatus that permits more critical monitoring of the dynamic weight changes that take place during the process. To this end, load cells are configured to sense the weights and weight changes of both on both the injector assembly and the growth chamber crucible.

It is a yet further object to provide critical process weight data with improved resolution for monitoring the process and calculating feedback control inputs. To this end, signal amplifiers may be programmable to output desired weight ranges and resolutions.

It is a still yet further object to provide means for transmitting weight data from vertically translating and rotating structures to a computer control system. To this end, electrical slip ring and contact assemblies or other mechanical or wireless means may be used to affect this function.

Still other objects and advantages of the present invention will become readily apparent to those skilled in this art from the following detailed description, wherein I have shown and described only a preferred embodiment of the invention, simply by way of illustration of the best mode contemplated by me on carrying out my invention.

DESCRIPTION OF THE PREFERRED EMBODIMENT

The invention is susceptible of many variations. Accordingly, the drawings and description of the preferred embodiment are to be regarded as illustrative in nature and not restrictive.

OVERVIEW OF THE STRUCTURE

Figure 1:
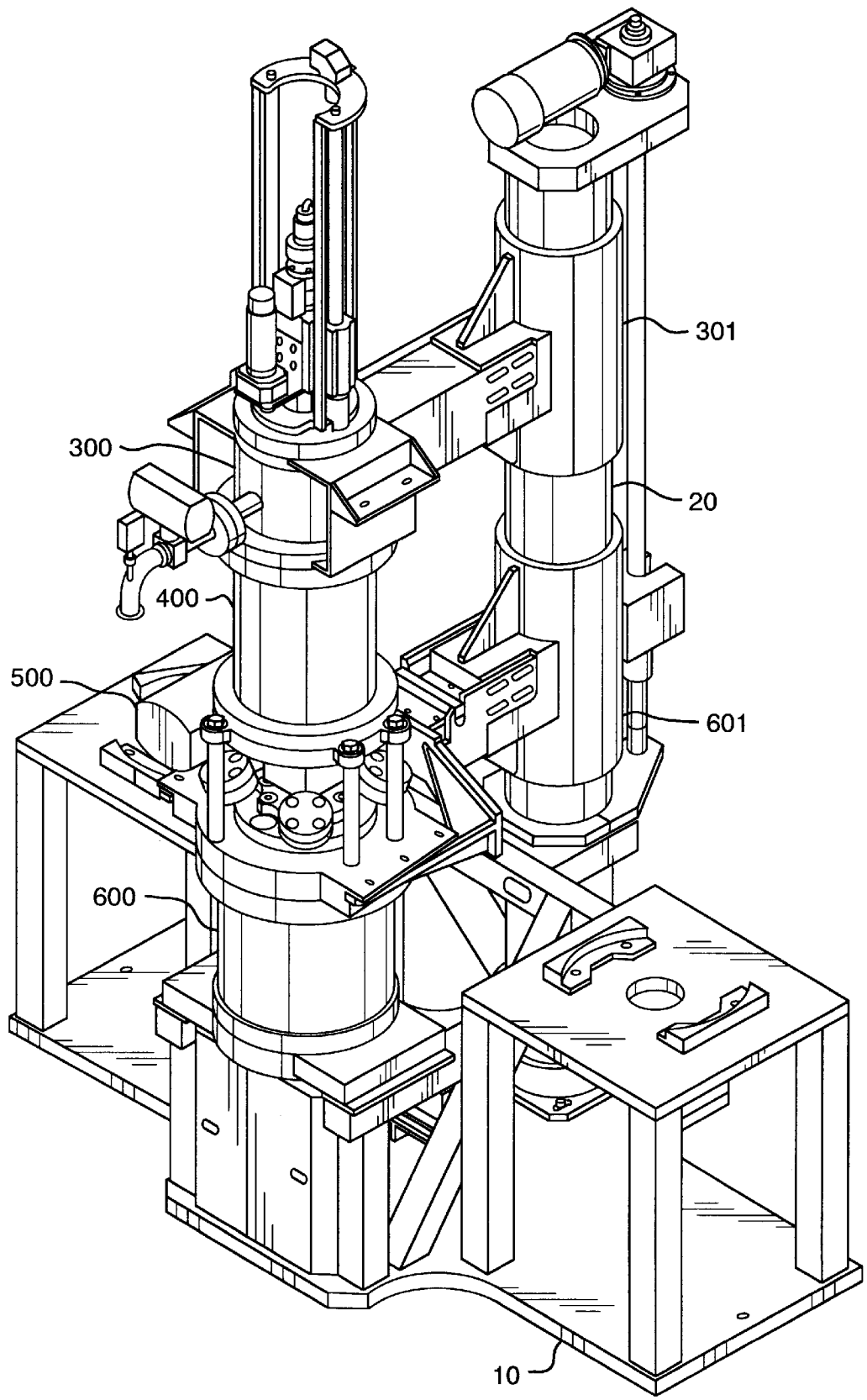
FIG. 1 is a perspective view of a crystal growth furnace.
Figure 2:
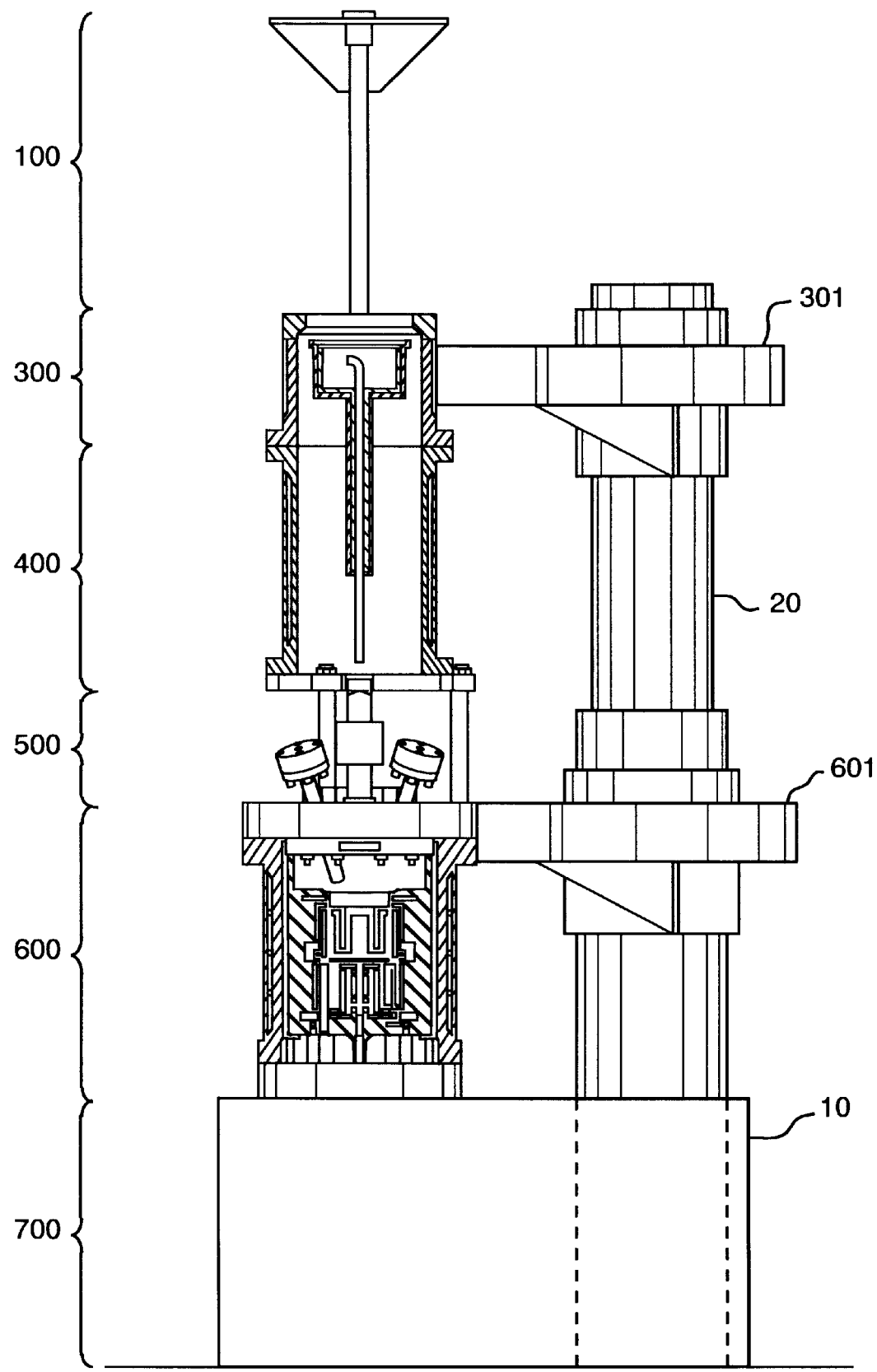
FIG. 2 is a diagrammatic side view of the overall apparatus of the invention, partially cut away to show internal details.

Referring to FIGS. 1 and 2, the relationship of the principle components of the system are clearly disclosed. These components include the growth chamber 600, the ball valve weldment 500, the injection chamber 400 and the seed chamber 300. The growth, injection and seed chambers are double walled, water cooled and made of 316 Stainless Steel and certified to ASME Section VIII, Division pressure vessel code. These principle components are vertically arranged and mated by means of flat faced flanges which are bolted together to secure the respective chambers when the system is subjected to high pressure.

Related components include the illustrated support structure with it's upper and lower vertically adjustable and independently ratable support arms 301 and 601, to which the seed chamber 300 and the growth chamber 600 are respectively attached. Arms 301 and 601 are mounted on vertical support shaft 20, the lower end of which is secured to base 10.

GROWTH CHAMBER

Figure 3:
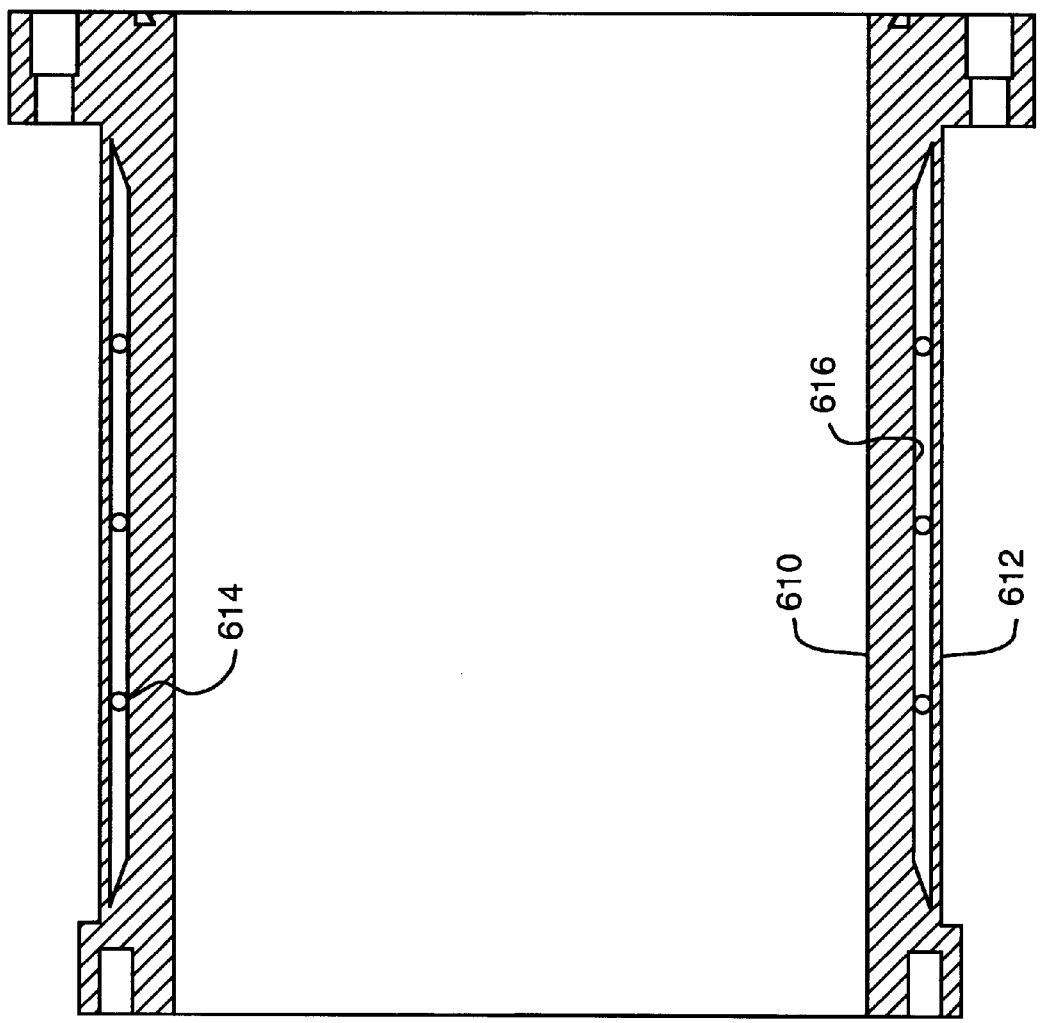
FIG. 3 is a cross section of the growth chamber of FIG. 2, showing inner thick wall, water channel and outer thin wall.
Figure 4:
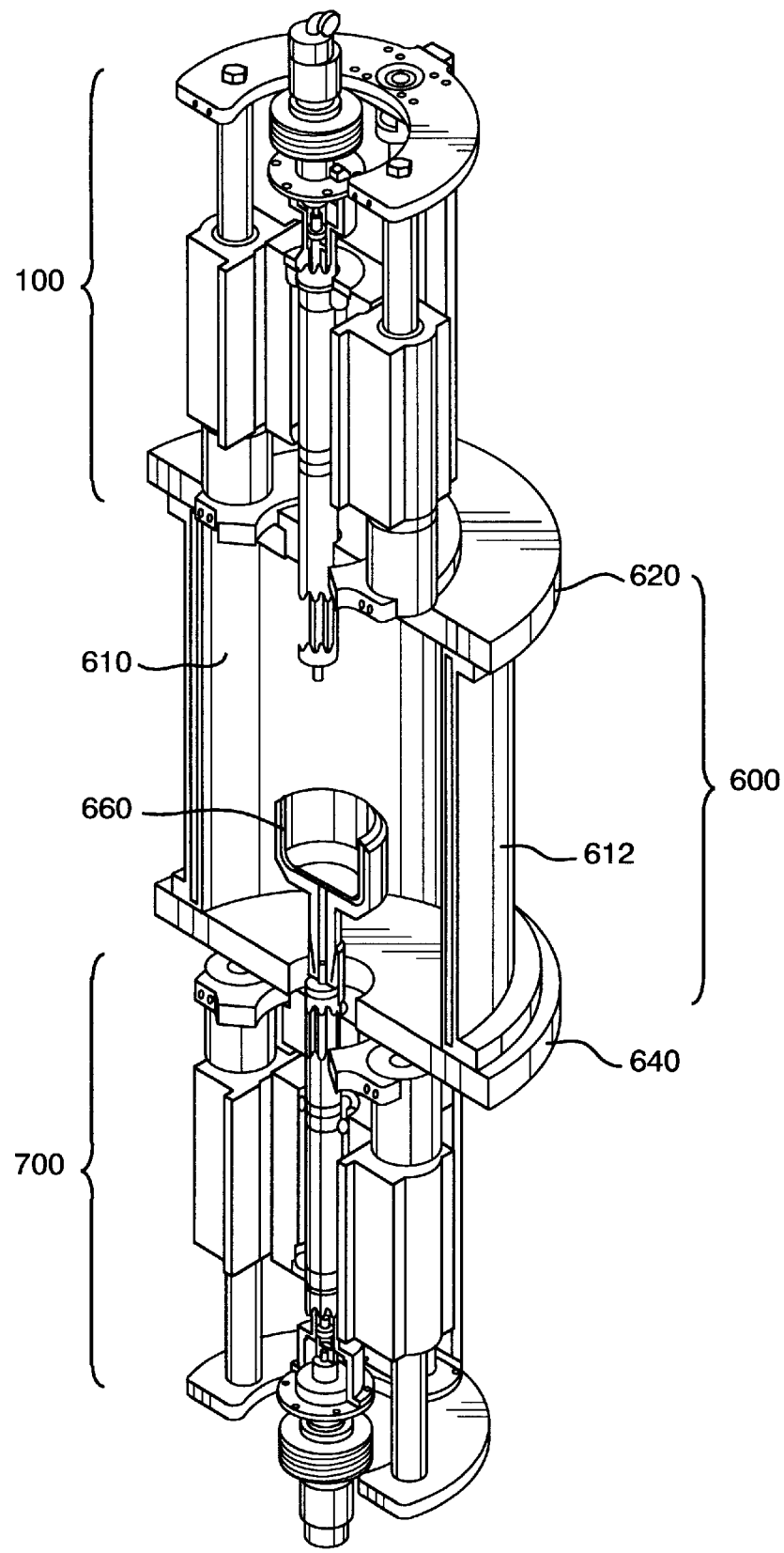
FIG. 4 is a perspective cross section view of the furnace of FIG. 1, configured without a ball valve weldment.

Referring to FIGS. 3 and 4, the growth chamber 600 is a double walled water cooled chamber certified to ASME Section VIII Division I Pressure Vessel Code. The inner thick shell 610 and outer thin shell 612 are made of 316 Stainless Steel. Between these two shells there are baffle rods 614 for water channel 616. The chamber is certified to a maximum allowable working pressure of 1200 psig at maximum hot wall temperature of 204° C. The seed chamber and injection chamber are similarly constructed.

The chambers are isolated from the environment. The chambers can be pressure or vacuum chambers depending on the process requirements. The chambers can be of varying geometry, and contain the process materials. The different chambers are similar in basic design. The growth chamber consists of a top plate 620, bottom plate 640, and hot zone 660.

The ball valve weldment 500 of FIGS. 1 and 2 can be omitted from the configuration, as shown in FIG. 4, for processes not involving seeding or multiple pulls.

HOT ZONE (WITHIN THE GROWTH CHAMBER)

Figure 5:
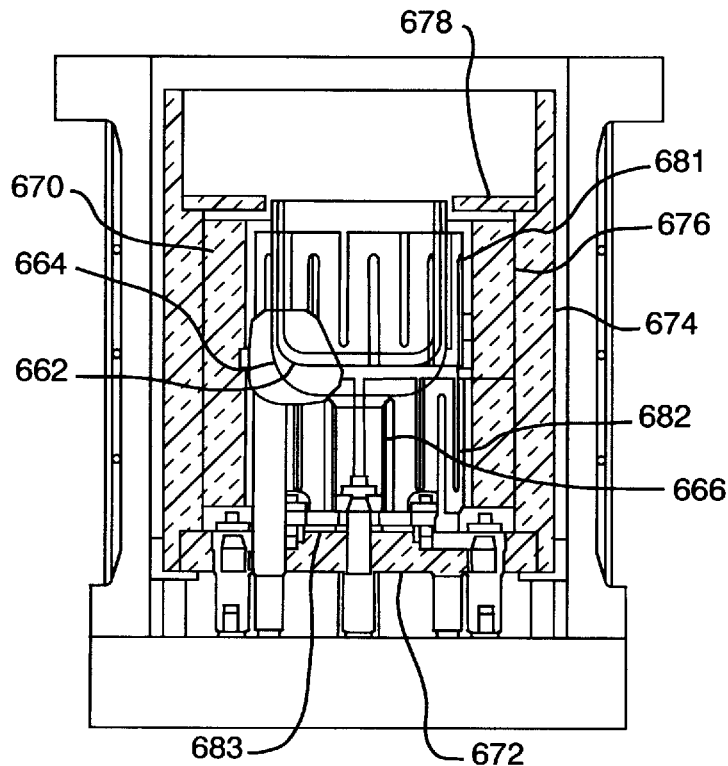
FIG. 5 is a diagrammatic side view of the hot zone within the growth chamber of FIG. 2, showing the three graphite heaters (upper heating element, lower heating element, bottom heating element), graphite susceptor, quartz crucible, crucible shaft and graphite insulation.
Figure 6:
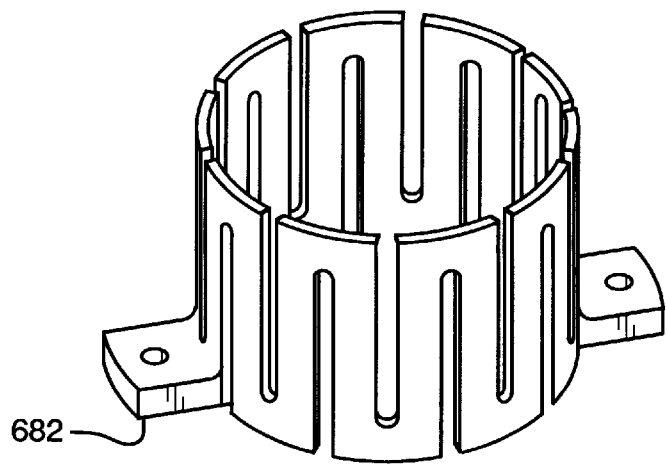
FIG. 6 is a perspective view of a heating element typical of the upper and lower heating element of FIG. 5.

Referring to FIGS. 5 and 6, the hot zone is configured with three independently controlled resistance heaters. These heaters are identified as the upper heating element 681, lower heating element 682 and bottom heating element 683 in the figures. A quartz or Pyrolitic Boron Nitride crucible 662 is illustrated mounted on a graphite susceptor 664 which is in turn mounted on the crucible shaft 666. The three heaters surround graphite susceptor 664 without contacting it. The hot zone 660 is thermally insulated with graphite insulation 670, including a bottom insulation disk 672 below the bottom disc heating element 683, hot zone insulation cylinder 674, insulation inlay or inner cylinder 676, and a hot zone insulation top disc 678.

GROWTH CHAMBER TOP PLATE ASSEMBLY

Figure 7:
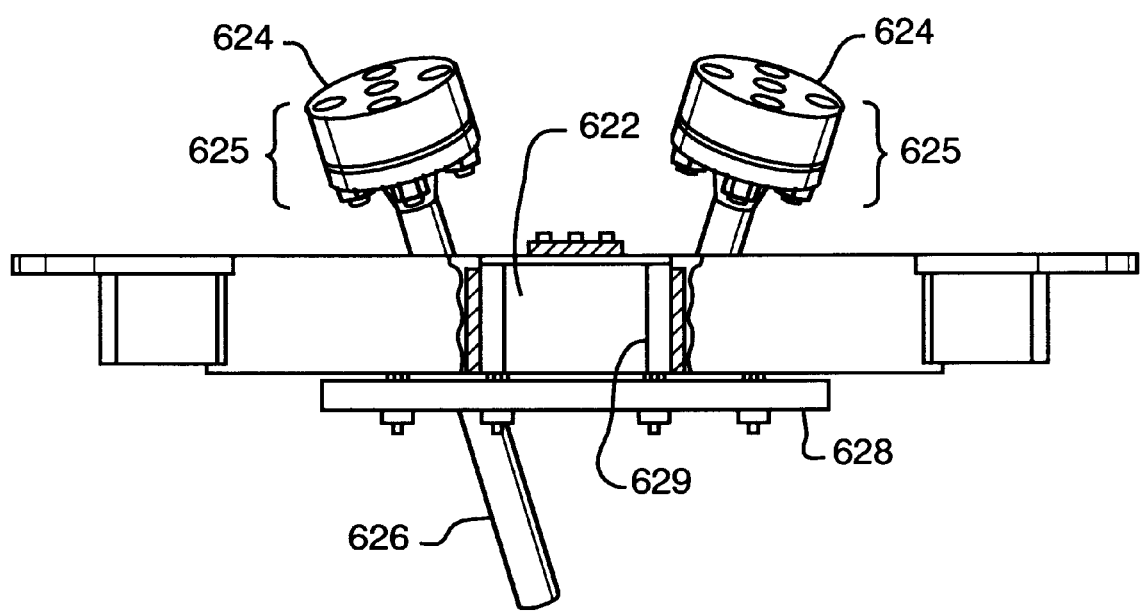
FIG. 7 is a side view, partially cut away, of the top plate of the growth chamber of FIG. 2, showing a quartz lens rod and graphite insulation.
Figure 8:
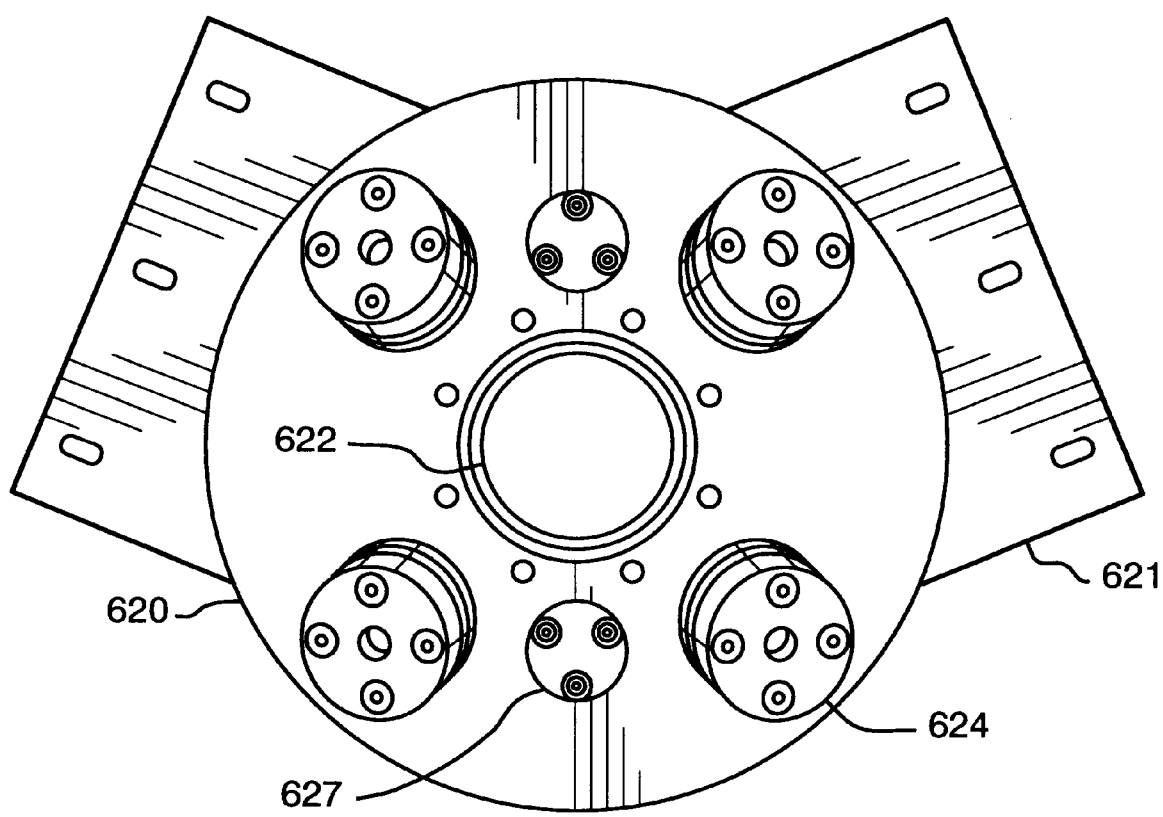
FIG. 8 is a top view of the top plate of FIG. 7, showing it's four angled full ports and two straight through ports.

FIGS. 7 and 8 show the growth chamber top plate 620 with related details. It shows shaft access bore 622, four angled full ports 624 and two straight through ports 627. It identifies the lens assembly 625, quartz lens rod 626 m growth chamber top plate weldment 621, top plate insulation shield 628, and top plate insulation insert 629.

GROWTH CHAMBER BOTTOM PLATE ASSEMBLY

Figure 9:
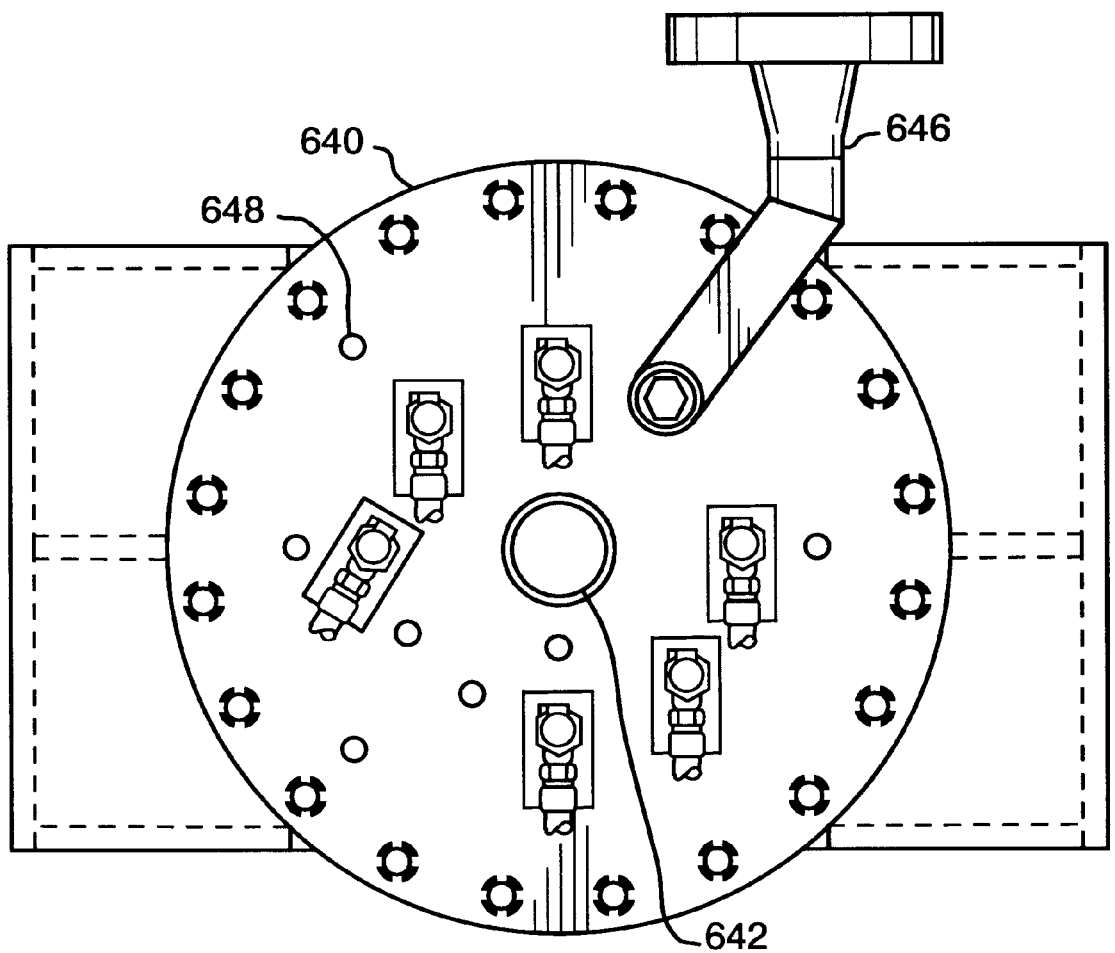
FIG. 9 is a bottom view of the bottom plate assembly of the growth chamber of FIG. 2, showing apertures for thermocouples, cooling water, and spares, electrical connections to the heating elements of FIGS. 5 and 6, the crucible shaft bore, and the vacuum pumpout port extension.
Figure 10:
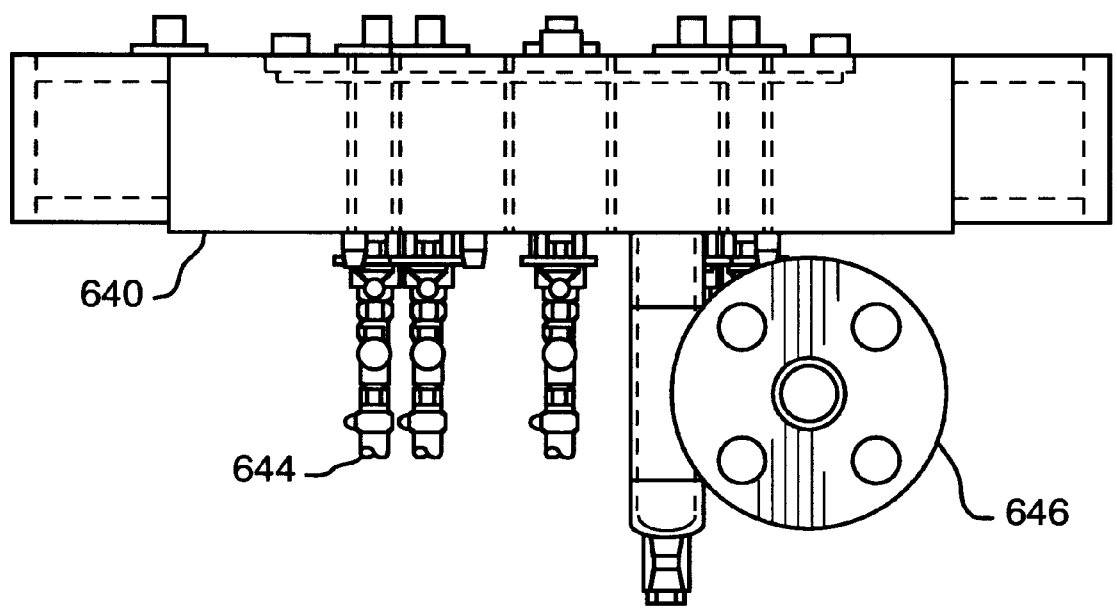
FIG. 10 is a cross section side view of the bottom plate assembly of FIG. 9.

FIGS. 9 and 10 show the growth chamber bottom plate 640 with related details, and identifies shaft access bore 642, electrodes 644, and water tube vacuum pump out port 646. It also shows the spare ports 648.

ISOLATION VALVE

Figure 11:
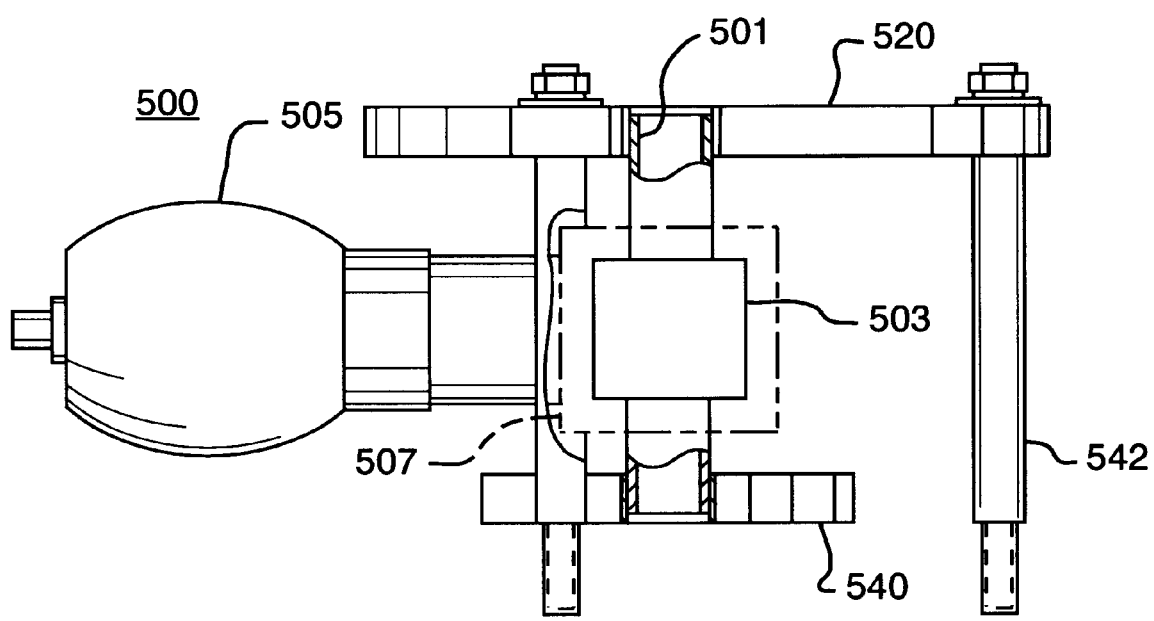
FIG. 11 is a side view of the ball valve weldment of FIG. 2, showing it's bottom plate, top plate, cooling jacket, ball valve with actuator, and supporting standoffs.
Figure 12:
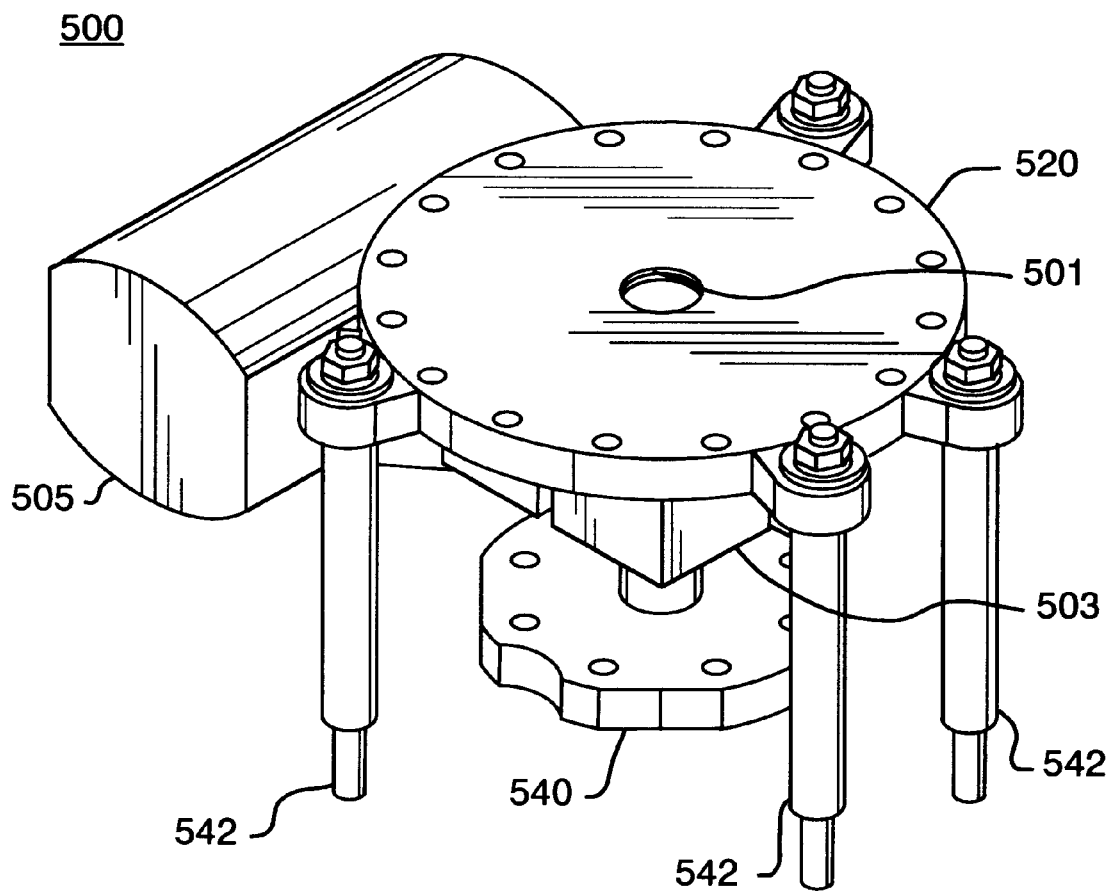
FIG. 12 is a perspective view of the ball valve weldment of FIG. 11.

FIGS. 11 and 12 show the ball valve weldment 500 and related details. Ball valve 503 acts as an isolation valve between chambers, and is configured to open and close bore 501. It is operated by pneumatic actuator 505 which is controlled manually or automatically by a computer control system. Bore 501 provides a two inch vertical opening directly into growth chamber 600 when ball valve 503 is in the open position, but closes off the bore to seal growth chamber 600 sufficiently tight to hold operating pressures within.

Also shown are the top plate 520 of ball valve weldment 500, that functions as the bottom plate of the injection chamber 400, and bottom plate 540 and supporting standoffs 542, that fasten to the top plate 620 of growth chamber 600, and cooling jacket 507 surrounding ball valve 503.

As was previously stated, ball valve weldment 500 may be omitted from the stack configuration for processes not needing the flexibility of closing off and maintaining the growth chamber under normal temperatures and pressures while reconfiguring the upper sections of the machine.

SYNTHESIS HOT ZONE

Figure 13:
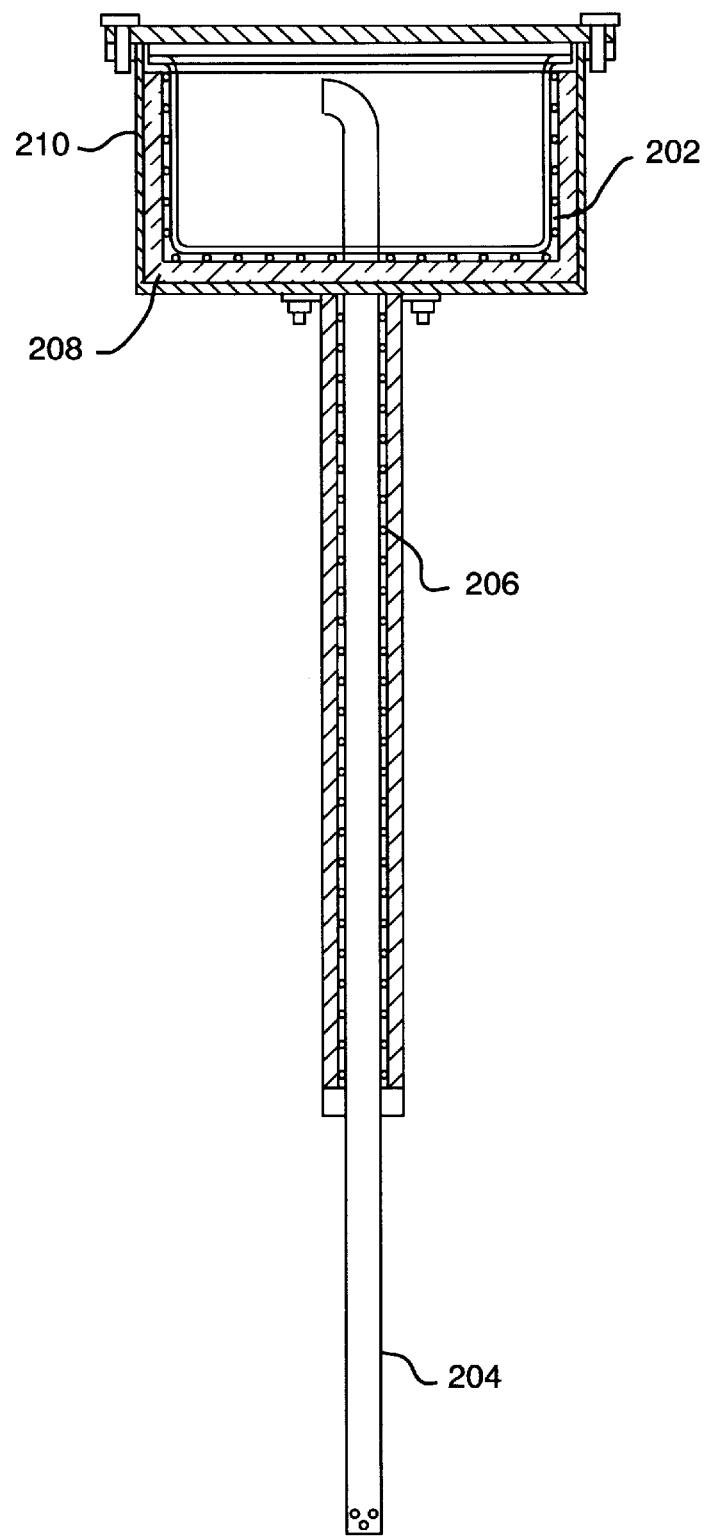
FIG. 13 is a diagrammatic cross section of the synthesis hot zone or injector assembly, showing the quartz ampoule and cover, quartz transfer tube, molybdenum heating elements, alumina insulation, and outer steel container.

FIG. 13 shows the synthesis injector assembly or hot zone assembly 200. Principle components shown are the quartz ampoule 202, transfer tube 204, Molybdenum heaters 206, alumina insulation 208 and stainless steel container 210.

UPPER LIFT ASSEMBLY

Figure 14:
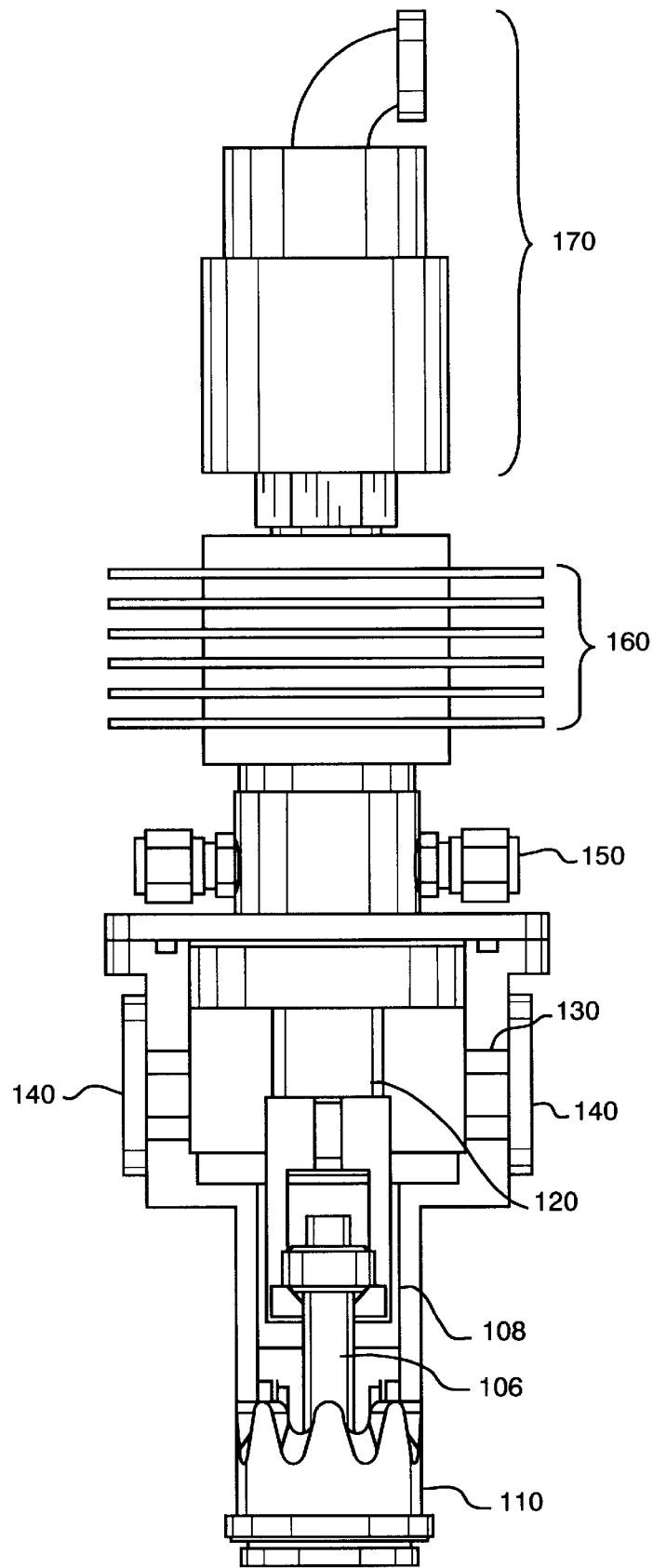
FIG. 14 is a partial cross section view of the upper lift assembly of the furnace of FIG. 2.

Referring to FIG. 14, the upper lift assembly 100 is shown with its components. The assembly includes a double walled water-cooled shaft assembly 110, which includes the hollow outer shaft 108 and solid inner shaft 106. The inner shaft 106 can have an axial bore for insertion of any process measurement probe such as a thermocouple. The inner shaft 106 is connected via a threaded connection at its upper end to a load cell 120. The load cell on its other end is connected to the outer shaft 108. Hot zone assembly 200 is attached to the lower end of inner shaft 106. The weight or force of the hot zone assembly 200 and its contents is exerted on the inner solid shaft and hence on the load cell 120 during the process.

Figure 15:
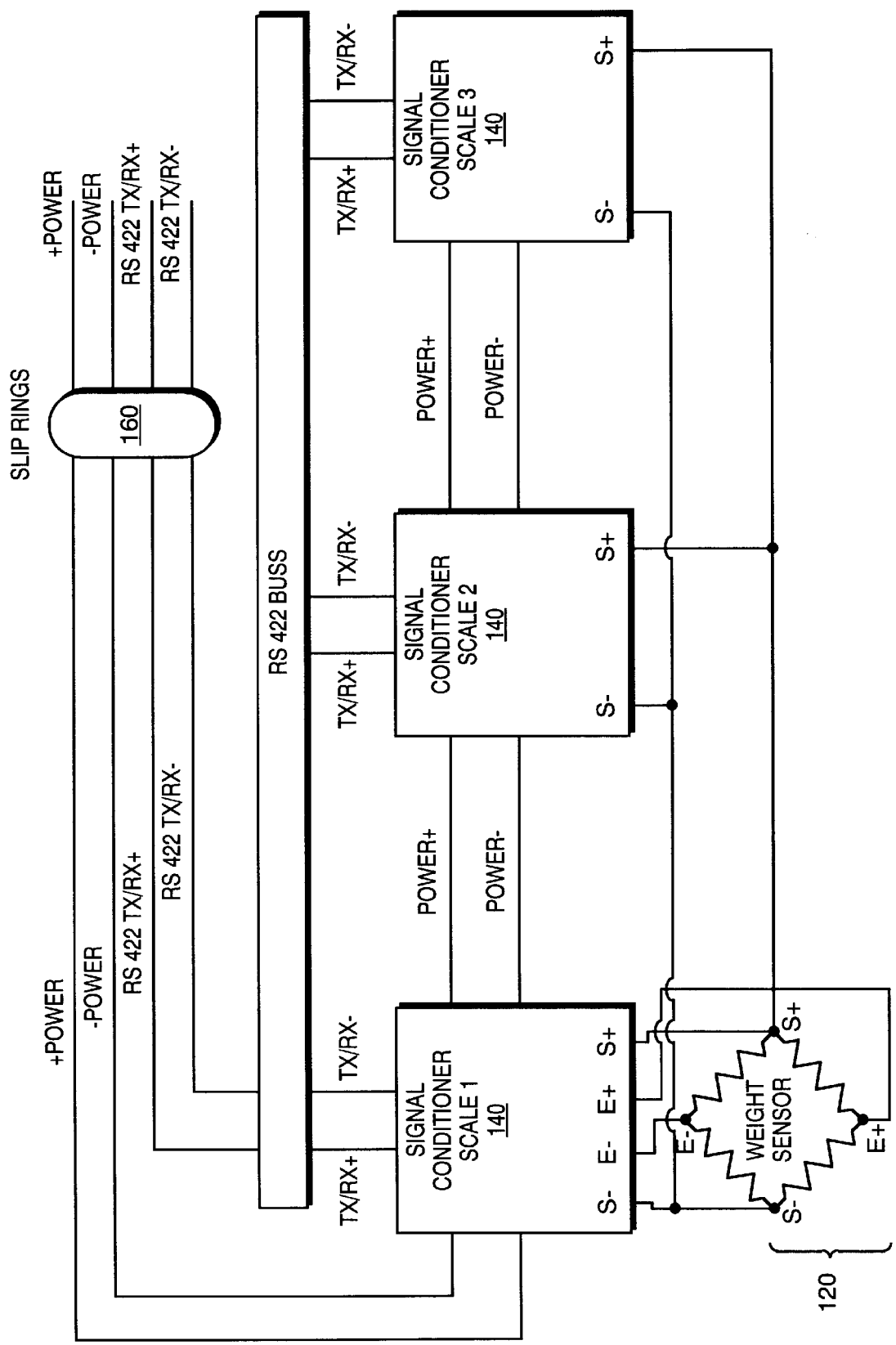
FIG. 15 is a block diagram of the signal processing of the system of FIG. 1.

Referring to FIGS. 14 and 15, the load cell weight or force signal, which is in tension in this case, is passed from load cell 120 through one of the pressure feed-thru ports 130 to multiple signal amplifiers 140 mounted externally of shaft assembly 110. Load cell 120 and shaft assembly 110 are cooled via coolant through coolant feeds 150. The signal through signal amplifiers 140 is passed through conductors to slip ring assembly 160, and hence to pickup brushes and to the computer control system (not shown here).

Signals from other shaft mounted process sensors such as a thermocouple signal can also be passed through the same or different pressure feedthru ports and then through the same or a different set of slip rings to pickup brushes and hence to the computer control system. Water deublin 170 provides the water for the cooling of shaft assembly 110 through coolant feeds 150.

LOWER LIFT ASSEMBLY

A lower lift assembly 700 located below growth chamber 600 and supporting the weight of crucible 662 of FIG. 5 is similar to upper lift assembly 100 of FIG. 14, except in length, and that the load is a compressive load as compared to the tension load on the upper shaft. Both assemblies can be vertically translating or rotating at various speeds, as directed by the computer control system (not shown).

GENERAL METHOD OF OPERATION

The compound crystals such as InP and GaAs need synthesis and growth compared to elemental single crystals such as Si or Ge which don't need synthesis. In this embodiment, the growth chamber containing the hot zone and crucible is charged with solid indium. The temperature and pressure are raised and indium is melted and brought to about 1063 degrees centigrade.

In the meanwhile, the Phosphorous ampoule in the seed chamber is also heated and brought to about 600 degrees centigrade. The injector tube emerging from the Phosphorous ampoule is then lowered through the open ball valve. The heated transfer tube enters the crucible which contains liquid indium and a layer of boric oxide on top. The phosphorous gas passing through the transfer tube then enters the crucible to form Indium Phosphide. The amount of phosphorous entering the crucible can be controlled by the independent heaters.

Once the synthesis is complete, the phosphorous ampoule assembly is retracted and the ball valve is closed, isolating the growth chamber at operating temperature and pressure. The secondary or injection chamber is then removed and the tertiary or seed chamber is secured to the top of the ball valve weldment. The pressure in the seed chamber is then equalized with the pressurize in the growth chamber, the ball valve opened and the seed rod holding the seed is lowered into the growth chamber. The single crystal starts to form around the seed.

In a typical growth run, a seed is attached to the solid shaft of upper lift assembly. A crucible is placed on the shaft of lower lift assembly. During the growth process the upper shaft assembly and load cell will face a tensile force as the crystal solidifies and the weight/force increases. The weight of the crystal increases in time, because more material solidifies and forms crystal. The opposite is true on the lower lift assembly where the weight will be compressive and will decrease in time due to the material lost as a result of its solidification and thereafter attachment to the upper shaft.

During synthesis of a compound the non-volatile material is melted in a crucible. Then an injector containing the other element is heated, and the vapors are injected into the melt. To prevent the vapors from escaping, a low density material such as boric oxide is placed on top in liquid form, forming an encapsulant and thereby preventing any vapors from escaping.

The crucible containing the melt which is being synthesized sits on the shaft and its weight is monitored continuously inside the pressure vessel. The weight monitoring is done via the strain gauge type load cell at the other end of the shaft. The weight change due to the injection is picked up by the lower load cell, and the signal is transferred out of the pressure chamber to the multiple signal amplifiers.

The same is true for the upper lift assembly where the injector is mounted and its weight change due to the transfer and sublimation of vapor is monitored by an upper load cell and thereafter transferred to multiple signal amplifiers. The signals from the load cells are transferred from the signal amplifiers through the slip rings to a computer control system where suitable algorithms are used to monitor and control the process for optimum pull rate and growth.

Figure 16:
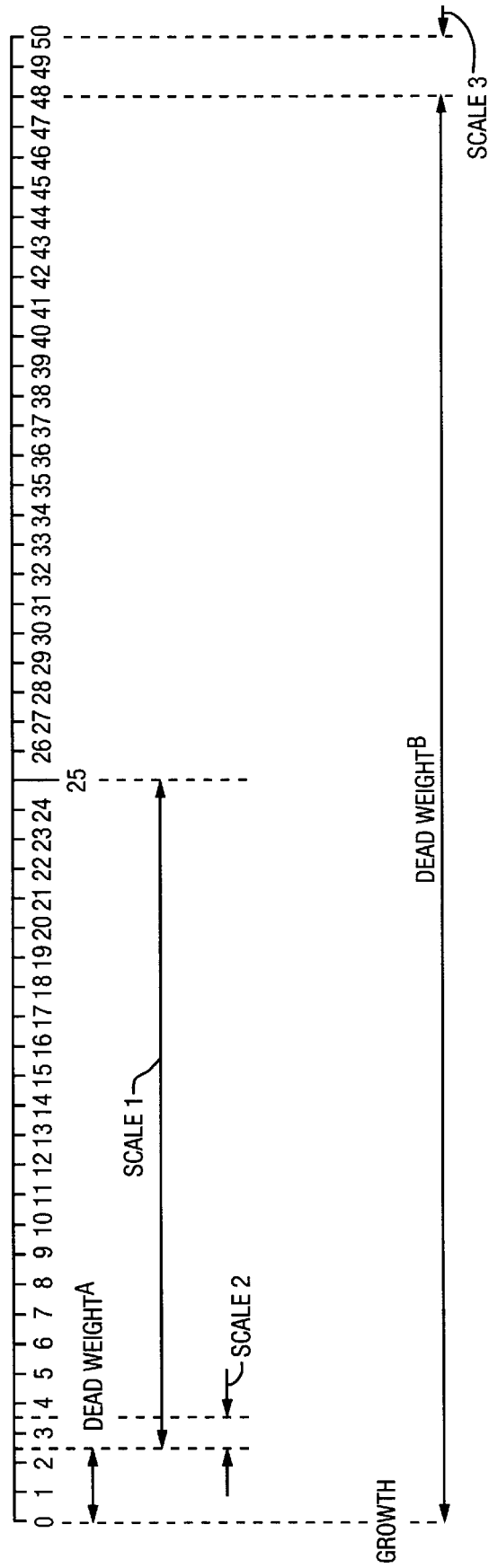
FIG. 16 is a chart of the respective weight spans and/or scales of interest in the operation of the furnace of FIG. 1.

With the information provided by the load cells and multiple, programmable signal amplifiers on upper and lower lift assemblies, this invention gives the user the flexibility to select various ranges or weight spans in order to optimize the resolution of the output data. Referring to FIG. 16, in a typical growth run, the dead weight A on the upper load cell can be zeroed out or canceled from consideration in calculations. Scale #1 illustrates a signal range set for the total weight span, i.e. the total weight of the object whose changed weight is being monitored. Another signal amplifier is set for a very narrow span or range labeled scale #2. Due to the relatively narrow range, the amplified signal of scale #2 indicates the weight of the growing crystal to a very high resolution. The signal amplifiers are programmable for range and interchangeable as required by the process. By the same token, the signal amplifiers from the lower lift assembly indicate the weight lost by the crucible with very high resolution. The two signals from the upper and lower lift assemblies can either be used individually or averaged together for process control. During an injection run the dead weight can be zeroed out or canceled, and scale #3 can be used to monitor the weight gained by the crucible or the weight gained by the injector assembly.

In case of accidental seed melting or incomplete injection, the ball valve is closed and reopened for compensation. In case of a twinned crystal (a major problem in InP growth), a new seed can be attached and introduced without loss of temperature and pressure in the growth chamber, because of the availability of the ball valve. This unique method uses the ball valve, multizone heating, and independent chambers for it's substantial improvements over older methods.

TYPICAL OPERATING CYCLE OF THE SYSTEM

CLEAN-OUT AND LOADING

The quartz ampoule of FIG. 13 is baked out in an oven at 140° C. for 1–2 hours. Then phosphorous is selected for the run. The phosphorus loading fixture is prepared and the injector is weighed and properly loaded with phosphorous.

Next the quartz crucible is cleaned and etched in 2% Bromine/Methanol solution for 20–30 minutes. It is then rinsed in methanol, dried and weighed. Next a dopant, Indium, and Boric Oxide are measured and weighed in sealed wrappers.

The injector is now inserted into a steel canister that contains the synthesis hot zone (comprising of Molybdenum heaters and Alumina insulation and thermocouples). The entire assembly is then tied onto the seed shaft.

Now the crucible is loaded with dopant and indium and all weights are recorded. Next boric oxide is loaded into the crucible. After this loading this crucible is placed on a graphite susceptor which is attached to a crucible shaft.

Then all chambers are closed, evacuated, and checked for symptoms of leaking. The covers of all chambers are sealed with bolts, and water and gas lines are connected.

SYNTHESIS OF INDIUM PHOSPHIDE

The vacuum valve at the bottom of the growth chamber is closed, water valves and gas line are opened. The chambers connected by the open ball valve, are back-filled with nitrogen to 100 psia. The control system is now turned on and the graphite susceptor is rotated. A CCD camera system on a view-port is engaged to the image processor, VCR, and monitor. A high intensity light is sent through another view-port. The camera is focused and its aperture is adjusted. The power is ramped to about 20% output. The temperature of melt in the crucible is brought to about 600–800° C. and melting of $B_2O_3$ (boric oxide) encapsulant is observed. When the boric oxide is melted, the nitrogen supply line is opened and the pressure chambers are filled to 600 psia. The ball valve is kept open during all this process.

When the base thermocouple approaches 1000° C., the injector is lowered and heating is turned on for the phosphorous injector. Now the graphite susceptor is raised to desired position, the injector is further lowered and the power on injector is ramped up. The injector is now lowered into the melt containing Indium and dopant. At this point the tip of the transfer tube is about 1–2 mm away from the crucible inside bottom.

At this time the injection/synthesis process starts. Now we monitor crucible and injector assembly weights, temperatures at critical points, chamber pressure, and heating power rates using load cell(s), thermocouples, CCD image, and signal outputs into a computer, as well as direct observation. The computer is provided with a suitable control algorithm and output capabilities. Using the various sensor data, the computer maintains automated process control of phosphorus evolution by varying power through injector heaters, and pressure regulation in the chamber.

When synthesis is complete, injector is withdrawn. The injector passes through the ball valve assembly. Now the ball valve is closed. The injection and seed chambers are vented whereas the growth chamber is still kept pressurized. The seed and injection chambers are now removed from the ball valve and swung aside.

Next the injector assembly is lowered from the seed shaft and removed. Then the seed and injection chamber are separated and a seed assembly is attached to the seed shaft. The seed chamber is then placed back on the system and bolted to the top of the ball valve weldment. The seed chamber is now evacuated, purged and pressurized to the same pressure as the growth chamber. When the pressure in both growth and seed chamber is same, the ball valve is opened.

GROWTH OF INDIUM PHOSPHIDE

At this time the susceptor position is adjusted as necessary. The rotation rate is increased in the seed shaft as well as the crucible shaft to the desired value. Translation and rotation of both the seed shaft and crucible shafts is controlled by the computer.

Next a seed is introduced via the seed shaft into the InP melt surface. A melt touch sensor attached to the seed shaft provides an indication of proper seed/melt interface/meniscus to the computer control system. If seeding is successful, the process is continued. If not, power is adjusted, the position of susceptor is changed, the melt is allowed to stabilize and another attempt for the seed contact is made again, all within the domain of the computer control system.

To continue the process, the control system establishes a power ramp down to grow crystal shoulder. When shoulder is calculated by the computer to be near full desired diameter, seed pulling is engaged and susceptor position adjustment is made through the control system. Power is ramped to control diameter variation. When the crystal is long enough it is withdrawn. Power is adjusted as needed for annealing conditions.

REMOVAL OF INDIUM PHOSPHIDE INGOT

Still under the control of the computer system, the ventilation system is turned on and all chambers are vented to 400 psia. The recirculator, water lines, and CCD Camera are shut down. The chambers are vented to a moderate rate of 14.7 psia to avoid flaming. Now the vacuum and high pressure lines are manually removed. The top plate bolts are removed. Next the seed chamber and the top plate are lifted up ½ to 3 inches to allow moderate smoke evolution. With a protective gear such as chemical resistant gloves, $H_2O_2$ is sprayed down into the vent tube, and throughout top plate and growth chamber walls.

Next the view windows and other places are cleaned with $H_2O_2$ and some time is allowed for smoke to begin clearing. Finally the seed chamber and top plate are removed completely while carefully watching for fire, sparking of phosphorus, and waterline snags. Next the crystal/seed coupling components and crystal are removed and weighed. The Boric Oxide layer is now rinsed with hot water. Next the susceptor is raised and its components disassembled and weighed.

As will be realized, the invention is capable of other and different embodiments, and its several details are capable of modifications in various obvious respects, all without departing from the essence of the invention.

For example, there is within the scope of the invention an improved high pressure crystal synthesis and growth system with improvements consisting of a growth chamber and an injector chamber interconnected by a vertical bore. An isolation valve and actuator is disposed between the growth chamber and the injector chamber and configured to open or close the bore in response to control inputs so as to connect or disconnect the growth chamber from the injector chamber. The valve isolates the growth chamber at operating temperature and pressure so that injector chamber can be physically detached from the valve weldment or opened as needed to correct or advance the process.

The isolation valve can be a ball valve or any other device or means for sealing off the bore in a manner that can be reopened later. The system may be reconfigurable for assembling the injector chamber directly to the growth chamber without the isolation valve and actuator.

As a further example, the invention may further include the injector chamber being configured with at least one electrical heating element.

As a yet further example, a system of the invention can have a lower lift assembly with a lower load shaft protruding up through the bottom of the growth chamber and supporting the crucible within the chamber, a load cell configured for measuring the weight supported by the lower load shaft and crucible, one or more lower lift assembly signal amplifiers which receive an input from the load cell, and means for connecting an output of the lower lift assembly signal amplifiers to a computer control system.

In this example, an upper lift assembly would have an upper load shaft for supporting the injector assembly, a load cell configured for measuring the weight supported by the upper load shaft and injector assembly, one or more upper lift assembly signal amplifiers receiving an input from the load cell, and means for connecting the output of the signal amplifiers to the computer control system.

This example may further have signal amplifiers that are programmable for load range and resolution, so that the dead weight of shafts and crucibles and the like can be programmed out or ignored, and the very small load ranges where the dynamics of the process occur can be monitored closely with very high resolution.

As a still yet further example, a system of the invention can have the upper load shaft being vertically translatable and ratable, with a slip ring and contact assembly or other mechanical or wireless means for connecting the output of the upper lift assembly signal amplifier to the computer control system. Further, the lower load shaft can also be ratable, and there may be a slip ring and contact assembly or other mechanical or wireless means for connecting the output of the lower lift assembly signal amplifier to the computer control system.

As an additional example, a system of the invention may have temperature, and pressure sensors in the process areas of the system generating additional outputs to the computer control system, with temperature, pressure and motion controls of the system being automatically controlled by the computer control system.

As another additional example, the invention may consist of a high pressure crystal growth system with a growth chamber, means for monitoring and controlling temperature and pressure in the system, a lower lift assembly with a lower load shaft protruding through the bottom of the growth chamber for supporting a crucible, a load cell configured for measuring the weight supported by the lower load shaft and crucible, at least one lower lift assembly signal amplifier receiving an input from the load cell, and means for connecting an output of the lower lift assembly signal amplifier to a computer control system.

This example can further include an upper lift assembly with an upper load shaft for supporting an injector assembly, a load cell configured for measuring the weight supported by the upper load shaft and the injector assembly, at least one upper lift assembly signal amplifier receiving an input from the load cell, and means for connecting an output of the upper lift assembly signal amplifier to the computer control system.

Previous and other examples of the invention may be further extended to have signal amplifiers that are programmable for load range and resolution by inputs from said computer control system, so that dead weights can be calculated out or ignored, and dynamic weight ranges or spans of the process can be monitored as direct readouts with high resolution. Previous and other examples of the invention having means for vertically translating and rotating the upper or lower load shafts, may be configured so as to have such means being operable by control inputs from the computer control system. Previous and other examples of the invention may have the crystal growing process of the system monitored and automatically controlled by the computer control system.

As another example, the invention includes a method for controlling the process of crystal growth, where the steps may include, in any order, using an improved high pressure crystal growth system of the invention, sensing the weight supported by the lower and upper load shafts including crucibles, injector assemblies, materials of the process and the dynamic changes in loads and transmitting it to the computer control system, programming the signal amplifiers for the load range of the dynamic weight change expected during the process, sensing and temperature and pressure within the system and transmitting the data to the computer control system, closing the isolation valve with the growth chamber at the elevated temperature and pressure of the process, physically detaching the injector chamber from its connection to the growth chamber, using the sensed data for calculating the feedback control inputs, and transmitting the control inputs to the means for controlling temperature and pressure and the means for vertically translating and rotating the upper load shaft.

The objects and advantages of the invention may be further realized and attained by means of the instrumentalities and combinations particularly pointed out in the appended claims. Accordingly, the drawing and description are to be regarded as illustrative in nature, and not as restrictive.

What is claimed is:

1. An improved high pressure crystal synthesis and growth system with improvements comprising:
    a growth chamber,
    an injector chamber interconnected by a vertical bore to said growth chamber, and
    an isolation valve and actuator disposed between said growth chamber and said injector chamber, said isolation valve and actuator configured to open or close said bore in response to control inputs so as to connect or disconnect said injector chamber and said growth chamber.

2. The improved high pressure crystal synthesis and growth system of claim 1, said improvements further comprising said injector chamber being detachable from said isolation valve and actuator while said growth chamber is pressurized and said bore is closed.

3. The improved high pressure crystal synthesis and growth system of claim 1, said improvements further comprising said isolation valve being a ball valve.

4. The improved high pressure crystal synthesis and growth system of claim 1, said improvements further comprising said injector chamber having at least one electrical heating element.

5. The improved high pressure crystal synthesis and growth system of claim 1, said isolation valve being removable from said system.

6. The improved high pressure crystal synthesis and growth system of claim 1, said improvements further comprising:
    a lower lift assembly further comprising a lower load shaft protruding through the bottom of said growth chamber for supporting a crucible within said growth chamber, a load cell configured for measuring the weight supported by said lower load shaft and said crucible, at least one lower lift assembly signal amplifier receiving an input from said load cell, and means for connecting an output of said lower lift assembly signal amplifier to a computer control system, and
    an upper lift assembly further comprising an upper load shaft for supporting an injector assembly, a load cell configured for measuring the weight supported by said upper load shaft and said injector assembly, at least one upper lift assembly signal amplifier receiving an input from said load cell, and means for connecting an output of said upper lift assembly signal amplifier to said computer control system.

7. The improved high pressure crystal synthesis and growth system of claim 6, said improvements further comprising said signal amplifiers being programmable for load range and resolution.

8. The improved high pressure crystal synthesis and growth system of claim 6, said means for connecting an output of any said assembly signal amplifier to said computer control system being wireless.

9. The improved high pressure crystal synthesis and growth system of claim 6, said improvements further comprising said upper load shaft being vertically translatable and ratable, said means for connecting said output of said upper lift assembly signal amplifier to said computer control system being a slip ring and contact assembly.

10. The improved high pressure crystal synthesis and growth system of claim 9, said improvements further comprising said lower load shaft being ratable, said means for connecting said output of said lower lift assembly signal amplifier to said computer control system being a slip ring and contact assembly.

11. The improved high pressure crystal synthesis and growth system of claim 10, said improvements further comprising temperature, and pressure sensors generating additional outputs to said computer control system, and temperature, pressure and motion controls of said system being automatically controlled by said computer control system.

12. An improved high pressure crystal growth system with improvements comprising:
    a growth chamber,
    an injection chamber,
    means for sensing temperature and pressure in said system, means for controlling temperature and pressure in said system, a lower lift assembly further comprising a lower load shaft protruding through the bottom of said growth chamber for supporting a crucible within said growth chamber, a load cell configured for measuring the weight supported by said lower load shaft and said crucible, at least one lower lift assembly signal amplifier receiving an input from said load cell, and means for connecting an output of said lower lift assembly signal amplifier to a computer control system, and an upper lift assembly further comprising an upper load shaft for supporting an injector assembly, a load cell configured for measuring the weight supported by said upper load shaft and said injector assembly, at least one upper lift assembly signal amplifier receiving an input from said load cell, and means for connecting an output of said upper lift assembly signal amplifier to said computer control system.

13. The improved high pressure crystal growth system of claim 12, said improvements further comprising said signal amplifiers being programmable for load range and resolution by inputs from said computer control system.

14. The improved high pressure crystal growth system of claim 12, said improvements further comprising means for vertically translating and rotating said upper load shaft, said means being operable by control inputs from said computer control system.

15. The improved high pressure crystal growth system of claims 14, said improvements further comprising said means for connecting said output of said upper lift assembly signal amplifier to said computer control system being a slip ring and contact assembly.

16. The improved high pressure crystal growth system of claim 14, said improvements further comprising said lower load shaft being ratable, said means for connecting said output of said lower lift assembly signal amplifier to said computer control system being a slip ring and contact assembly.

17. The improved high pressure crystal growth system of claim 12, said improvements further comprising the process of said system being monitored and automatically controlled by said computer control system.

18. A method for conducting a process of crystal growth utilizing the improved high pressure crystal growth system of claim 14, comprising in any order the steps of:

sensing the weight supported by said lower load shaft, transmitting lower load shaft weight data to said computer control system, sensing the weight supported by said upper load shaft, transmitting upper load shaft weight data to said computer control system, sensing temperature and pressure within said system, transmitting system temperature and pressure data to said computer control system, calculating feedback control inputs from said data, and transmitting said control inputs to respective said means for controlling said temperature and pressure and to said means for vertically translating and rotating said upper load shaft.

19. The method for conducting a process of crystal growth of claim 18, further comprising in any order the step of:

programming said signal amplifiers for selected weight ranges.

20. The method for conducting a process of crystal growth of claim 18, wherein said system further comprises said injector chamber interconnected by a vertical bore to said growth chamber and an isolation valve and actuator disposed between said growth chamber and said injector chamber, said isolation valve and actuator configured to open or close said bore in response to control inputs from said computer control system, said method further comprising in any order the steps of:

closing said isolation valve with said growth chamber at elevated pressure and temperature, and detaching said injection chamber from said growth chamber.

* * * * *

United States Patent and Trademark Office

Certificate of Correction

PATENT NO : 6,019,841
DATED : Feb 1, 2000
INVENTOR : Jafri et al.

It is certified that errors appear in the above-identified patent and that said Letters Patent are hereby corrected as shown below:

Col. 1: line 46, delete "1889", insert --1989--.
Col. 5: line 19, delete "pressurize", insert --pressure--; line 20, delete "valve opened", insert --valve is opened--.

Signed and Sealed this

Fifteenth Day of May, 2001

Attest:

NICHOLAS P. GODICI

Attesting Officer

Acting Director of the United States Patent and Trademark Office